United States Patent
Maruyama et al.

[11] Patent Number: 5,147,465
[45] Date of Patent: Sep. 15, 1992

[54] METHOD OF CLEANING A SURFACE

[75] Inventors: Takahiro Maruyama; Toshiaki Ogawa; Hiroshi Morita; Tomoaki Ishida; Kenji Kawai, all of Itami, Japan

[73] Assignee: Mitsubishi Denki Kabushiki Kaisha, Japan

[21] Appl. No.: 605,427

[22] Filed: Oct. 30, 1990

[30] Foreign Application Priority Data

Dec. 13, 1989 [JP] Japan ................................. 1-321471

[51] Int. Cl.⁵ .......................................... H01L 21/00
[52] U.S. Cl. ......................................... 134/1; 156/643; 156/646; 156/668
[58] Field of Search ............... 156/643, 345, 668, 646; 204/192.32; 134/1

[56] References Cited

U.S. PATENT DOCUMENTS

| | | | |
|---|---|---|---|
| 3,673,071 | 6/1972 | Pritchard et al. | 204/192.24 |
| 3,983,264 | 9/1976 | Schroen et al. | 204/192.3 |
| 4,244,799 | 1/1981 | Fraser et al. | 156/643 |
| 4,711,698 | 12/1987 | Douglas | 156/643 |
| 4,795,717 | 1/1989 | Okamura | 437/176 |
| 4,831,963 | 5/1989 | Saito et al. | 118/723 |
| 4,863,561 | 9/1989 | Freeman et al. | 134/1 |
| 5,002,632 | 3/1991 | Loewenstein et al. | 156/345 |

OTHER PUBLICATIONS

Ikawa et al, "Si Surface Treatment Using Deep UV Irradiation", 1985 Dry Process Symposium, NEC Corporation, pp. 25-29.

Irino et al, "The Removal Method of Carbon Contamination By R.I.E.", Applied Physics Society, 1987, p. 562.

Primary Examiner—David A. Simmons
Assistant Examiner—George Goudreau
Attorney, Agent, or Firm—Leydig, Voit & Mayer

[57] ABSTRACT

A method of cleaning a surface including generating helium ions, electrons, and metastable helium by exciting helium gas, separating said metastable helium from the helium ions and electrons, and exposing a substance to be processed on the surface of which foreign matter is present to the metastable helium separated from the helium ions and electrons to remove the foreign matter from the substance.

2 Claims, 2 Drawing Sheets

METHOD OF CLEANING A SURFACE

BACKGROUND OF THE INVENTION

1. Field of the Invention

The present invention relates to an apparatus for and method of cleaning a surface, and particularly to an apparatus for and method of removing foreign matter deposited on a semiconductor substrate in the process of manufacturing semiconductor devices.

2. Description of the Related Art

In the process of manufacturing semiconductor devices such as memory devices, foreign matter composed of polymers or the like is sometimes deposited on the surface of a semiconductor substrate. If semiconductor devices are manufactured with such foreign matter deposited on the semiconductor substrate, a problem arises in that the electrical characteristics of the semiconductor device obtained as a product deteriorate. Hence, after foreign matter deposited on a semiconductor substrate is removed the next process is performed.

For example, the process of manufacturing semiconductor memory devices includes a process in which a silicon oxide film 2 is formed on a silicon substrate 1, as shown in FIG. 3A. Then the film 2 is subjected to patterning with a photoresist 3, as shown in FIG. 3B, and with this photoresist 3 as a mask, the silicon oxide film 2 is selectively etched, as shown in FIG. 3C. Usually, the silicon oxide film 2 is etched in an etching chamber using $CHF_3$, $C_mF_n+H_2$ or the like as ann etching gas. $C_xF_y$ type polymers are formed in the etching chamber during this etching. These polymers are deposited on the surface of the silicon substrate 1 that is exposed as a result of etching, thereby forming a foreign matter layer 4, as shown in FIG. 3C. If this foreign matter layer 4 is allowed to stay, it will be difficult to manufacture a semiconductor memory device which exhibits excellent electrical characteristics.

For this reason, in the prior art, $SF_6$, $O_2$ or the like is used as a reactive gas and plasma etching is performed. After the foreign matter layer 4 accumulated on the silicon substrate 1, as shown in FIG. 3D, is removed, the next process is performed.

However, if plasma etching is performed, since the surface of the silicon substrate 1 is exposed to a plasma, damage may be caused due to the impact of electrons and charged particles such as ions and variations in the potential on the surface. As a result, a problem exists in that the electrical characteristics of manufactured semiconductor devices deteriorate.

SUMMARY OF THE INVENTION

The present invention has been devised to solve these problems. Accordingly, an object of the present invention is to provide an apparatus for and method of cleaning a surface removing foreign matter deposited on the surface of a substance to be processed and at the same time reducing damage caused to the substance to be processed.

The apparatus for cleaning a surface of the present invention comprises first and second reaction containers, means for holding a substance to be processed in the second reaction container on the surface of which foreign matter is present means for supplying helium gas into the first reaction container, means for generating helium ions, electrons and metastable helium by exciting helium gas in the first reaction container, and means for separating metastable helium generated in the first reaction container from helium ions and electrons and for introducing the metastable helium into the second reaction container.

The method of cleaning a surface of the present invention comprises the steps of generating helium ions, electrons and metastable helium by exciting helium gas, separating the metastable helium from the helium ions and electrons, and exposing a substance to be processed on the surface of which foreign matter is present to the separated metastable helium.

These and other objects, features and advantages of the present invention will become clear from the following description of the preferred embodiment of the present invention, together with reference to the accompanying drawings.

DETAILED DESCRIPTION OF THE PREFERRED EMBODIMENT

The embodiment of the present invention will be explained hereinunder with reference to the accompanying drawings.

Figure 1:
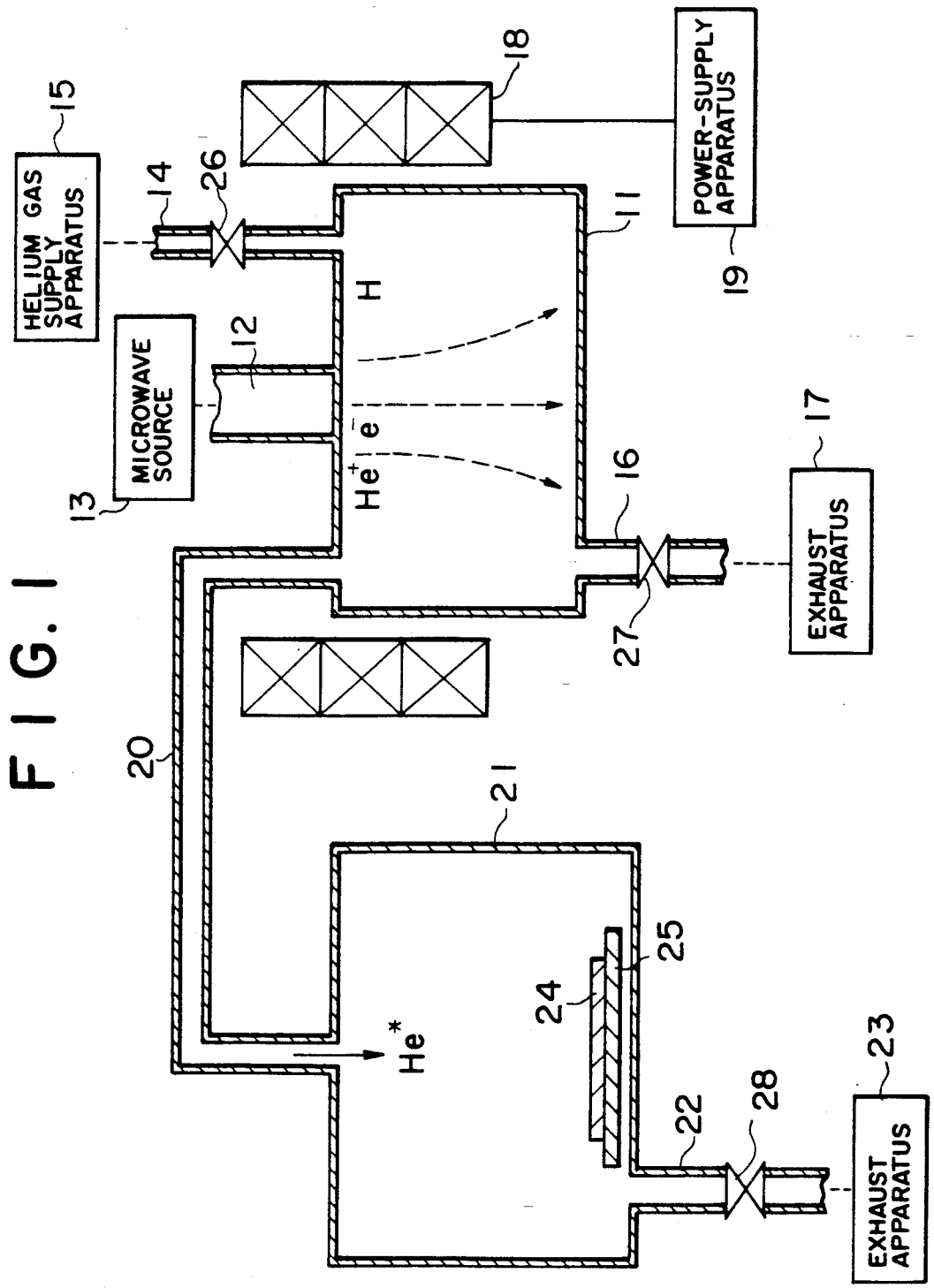
FIG. 1 is a cross-sectional view illustrating an apparatus for cleaning a surface in one embodiment of the present invention.

In FIG. 1, a microwave source 13 is connected to the upper center of an ECR (Electron Cyclotron Resonance) chamber 11, which serves as the first reaction container, via a waveguide 12.

A helium gas supply apparatus 15 is connected to the upper portion of the ECR chamber 11 via a supply pipe 14, and an exhaust apparatus 17 is connected to the lower portion of the ECR chamber 11 via an exhaust pipe 16. Electromagnetic coils 18 surround the ECR chamber 11 and are electrically connected to a power-supply apparatus 19.

One end of a guide pipe 20 is open near an upper portion of the ECR chamber 11, and the other end of this guide pipe 20 is open into a reaction chamber 21 which serves as the second reaction container. An exhaust apparatus 23 is connected to the reaction chamber 21 via an exhaust pipe 22. A holding apparatus 25 for holding the substance to be processed 24 is positioned in the reaction chamber 21. Regulating valves 26, 27 and 28 for regulating the flow rate of gas are respectively disposed in the supply pipe 14, and the exhaust pipes 16 and 22.

Next, the operation of this embodiment will be explained. First, the substance to be processed 24 on which foreign matter is deposited is held by the holding apparatus 25 in the reaction chamber 21.

Next, microwaves of a frequency of 2.45 GHz are radiated into the ECR chamber 11 via the waveguide 12 from the microwave source 13 and a current is allowed to flow through the electromagnetic coils 18 from the power supply apparatus 19, thereby forming a magnetic field H in the ECR chamber 11. When helium gas is supplied to the ECR chamber 11 via the supply pipe 14 from the helium gas supply apparatus 15 in this state, the helium gas is excited by electron cyclotron resonance and is converted to helium ions $He^+$ and electrons $e^-$, or metastable helium He*. That is, it follows that helium ions He+ and the electrons e−, which are all charged particles, and electrically neutral metastable helium He* and helium gas which is not excited are mixed in the ECR chamber 11. However, since the magnetic field H is produced by the electromagnetic coils 18 in the ECR chamber 11, the charged particles are accelerated along the magnetic field downward from the ECR chamber 11, while metastable helium He* and helium gas, which do not have an electric charge, diffuse isotropically in the ECR chamber 11.

For this reason, the density of charged particles is lower near the upper portion of the ECR chamber 11 at the guide pipe 20 opening. Therefore, by regulating the exhaust flow rate from the exhaust apparatuses 17 and 23 using the regulating valves 27 and 28 of the exhaust pipes 16 and 22, the metastable helium He* can be separated from the helium ions He+ and electrons e− from near the upper portions of the ECR chamber 11 and can be introduced into the reaction chamber 21 together with helium gas at a desired flow rate.

Metastable helium He* has an extremely long average lifetime of about $6 \times 10^5$ sec. Therefore, most of the metastable helium He* introduced into the guide pipe 20 reaches the reaction chamber 21. Some of the metastable helium particles collide with the surface of the substance to be processed 24 held by the holding apparatus 25.

Figure 2:
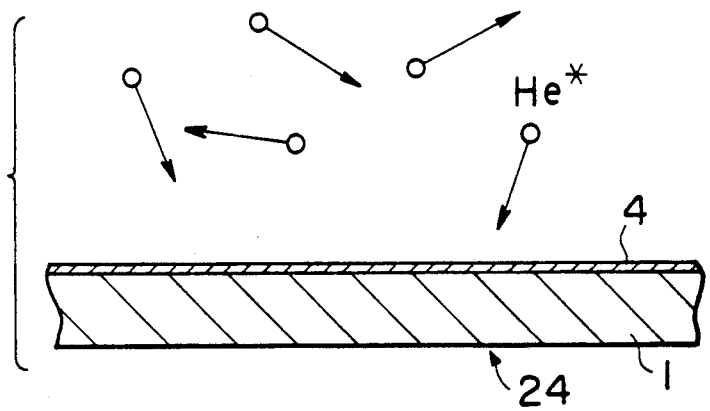
FIG. 2 is a view schematically illustrating the operation of the embodiment.
Figure 3A:
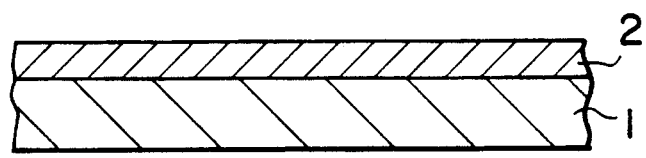
FIGS. 3A to 3D are cross-sectional views respectively illustrating a process of manufacturing semiconductor devices.
Figure 3B:
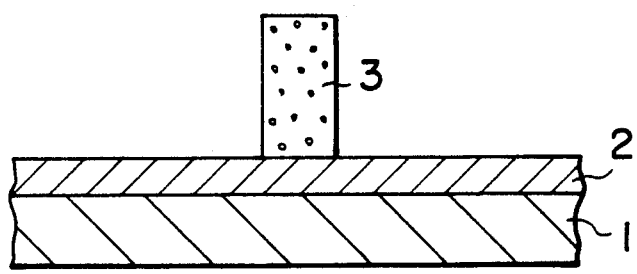
Figure 3C:
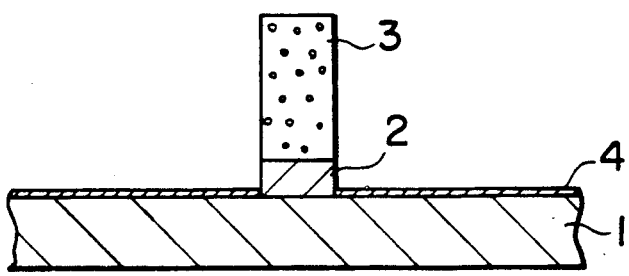
Figure 3D:
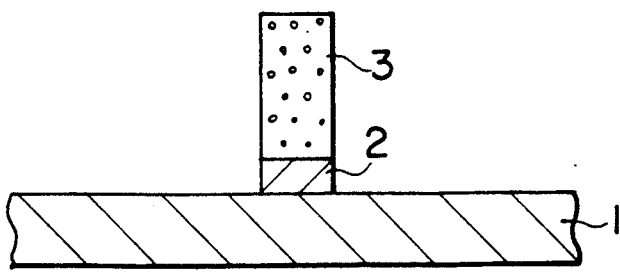

The substance to be processed 24 is, for example, such that foreign matter layer 4 of $C_xF_y$ type polymer or the like is present on the silicon substrate 1, as shown in FIG. 2. Metastable helium He* strikes this foreign matter layer 4. Because the activation energy of the metastable helium He* is huge, about 20 eV, metastable helium He* that has struck the foreign matter layer 4 provides energy to the foreign matter and the foreign matter is separated from the silicon substrate 1.

In this way, foreign matter separated from the silicon substrate 1 is made to pass through the exhaust pipe 22 together with helium gas and metastable helium He* and is discharged from the reaction chamber 21 by the exhaust apparatus 23.

Helium is an inert element, therefore there is no possibility of helium chemically reacting with the surface of the silicon substrate 1 in the reaction chamber 21.

Therefore, by exposing the silicon substrate 1 with the foreign matter layer 4 present thereon to metastable helium He* which is composed of neutral particles having a large activation energy, the foreign matter layer 4 can be removed with almost no damage to the silicon substrate 1. As a result, a semiconductor device with excellent characteristics can be manufactured.

In the above-mentioned embodiment, a polymeric foreign matter layer 4 present on the silicon substrate 1 is removed. However, other semiconductor substrates may be used. The present invention can be widely used in the manufacture of various kinds of semiconductor devices.

Many widely different embodiments of the present invention can be made without departing from the spirit and scope thereof, therefore it is to be understood that this invention is not limited to the specific embodiment thereof except as defined in the appended claims.

What is claimed is:

1. A method of cleaning a surface of s substrate comprising:

producing a magnetic field in a first chamber;
introducing helium into the first chamber;
exciting the helium in the first chamber to produce helium ions, electrons, and metastable helium;
separating the helium ions and the electrons from the metastable helium in the first chamber by deflecting the helium ions and the electrons with the magnetic field; and
conducting the metastable helium from the first chamber to a second chamber and to a surface of a substrate on which contaminants are present in the second chamber to interact with and remove the contaminants without etching of the surface of the substrate.

2. A method according to claim 1 including exciting said helium gas by electron cyclotron resonance.

* * * * *

UNITED STATES PATENT AND TRADEMARK OFFICE
CERTIFICATE OF CORRECTION

PATENT NO. : 5,147,465
DATED : September 15, 1992
INVENTOR(S) : Maruyama et al

It is certified that error appears in the above-indentified patent and that said Letters Patent is hereby corrected as shown below:

Claim 1, column 4, line 25, change "s" to --a--.

Signed and Sealed this

Fourteenth Day of September, 1993

Attest:

BRUCE LEHMAN

*Attesting Officer*    *Commissioner of Patents and Trademarks*